US011340261B2

(12) United States Patent
Mazzeo et al.

(10) Patent No.: US 11,340,261 B2
(45) Date of Patent: May 24, 2022

(54) FLEXIBLE ELECTRIC PROBE

(71) Applicant: Brigham Young University (BYU), Provo, UT (US)

(72) Inventors: Brian A. Mazzeo, Provo, UT (US); John Vogel, Orem, UT (US); Dean Wheeler, Orem, UT (US); Emilee Hardy, Meridian, ID (US); Derek Clement, Kent, WA (US)

(73) Assignee: BRIGHAM YOUNG UNIVERSITY, Provo, UT (US)

( * ) Notice: Subject to any disclaimer, the term of this patent is extended or adjusted under 35 U.S.C. 154(b) by 139 days.

(21) Appl. No.: 16/483,153

(22) PCT Filed: Feb. 2, 2018

(86) PCT No.: PCT/US2018/016663
§ 371 (c)(1),
(2) Date: Aug. 2, 2019

(87) PCT Pub. No.: WO2018/144878
PCT Pub. Date: Aug. 9, 2018

(65) Prior Publication Data
US 2020/0241046 A1  Jul. 30, 2020

Related U.S. Application Data

(60) Provisional application No. 62/453,846, filed on Feb. 2, 2017.

(51) Int. Cl.
*G01R 1/067*    (2006.01)
*G01R 1/073*    (2006.01)

(52) U.S. Cl.
CPC .................. *G01R 1/0735* (2013.01)

(58) Field of Classification Search
CPC .............. G01R 1/0735; G01R 1/07314; G01R 1/06711; G01R 1/07342; G01R 1/07307;
(Continued)

(56) References Cited

U.S. PATENT DOCUMENTS 4,563,640 A * 1/1986 Hasegawa .......... G01R 1/07342
324/72.5
5,378,982 A * 1/1995 Feigenbaum ........ G01R 1/0735
324/756.02
(Continued)

FOREIGN PATENT DOCUMENTS

JP    62-261972 A    11/1987
JP    2-108974 A     4/1990
JP    2011226903 A   11/2011

OTHER PUBLICATIONS

International Search Report and Written Opinion for International Search Report PCT/US2018/016663, dated May 22, 2018, 17 pages.
(Continued)

*Primary Examiner* — Thang X Le
(74) *Attorney, Agent, or Firm* — Brake Hughes Bellermann LLP

(57) ABSTRACT

A flexible electric probe can include: a flexible substrate; and probe line conductors on the flexible substrate, the probe line conductors being essentially parallel to each other and having separations of about 5-50 microns. The flexible electric probe can further include connection conductors on the flexible substrate, the connection conductors and the probe line conductors electrically connected to each other, the probe line conductors positioned in first and second offset patterns with regard to the connection conductors.

24 Claims, 12 Drawing Sheets

(58) Field of Classification Search
CPC ............ G01R 1/07357; G01R 1/06722; G01R 1/06716; G01R 1/0466; G01R 1/06755; G01R 1/06788; G01R 31/2889; G01R 31/3627; G01R 31/3682; G01R 31/3696; G01R 31/2831; G01R 324/437; G01R 324/446; G01R 324/724; G01R 324/149
See application file for complete search history.

(56) References Cited

U.S. PATENT DOCUMENTS

| | | | | |
|---|---|---|---|---|
| 5,491,427 | A | * | 2/1996 | Ueno ................. G01R 1/07364 324/750.16 |
| 5,951,323 | A | * | 9/1999 | Hofmann ............... A61B 5/283 439/482 |
| 6,323,661 | B1 | | 11/2001 | Wildes et al. |
| 6,420,889 | B1 | * | 7/2002 | Terada ..................... G01R 1/18 324/750.27 |
| 7,030,633 | B1 | | 4/2006 | Qiu et al. |
| 2004/0217762 | A1 | | 11/2004 | Gifford |
| 2005/0007130 | A1 | * | 1/2005 | Yoshida ............. G01R 1/07342 324/755.09 |
| 2005/0062470 | A1 | * | 3/2005 | Shoji .................. G01N 27/9006 324/240 |
| 2009/0315540 | A1 | * | 12/2009 | Goldfine ............... B24B 37/005 324/202 |
| 2014/0303916 | A1 | | 10/2014 | Mazzeo et al. |
| 2015/0362551 | A1 | * | 12/2015 | Saunders ........... G01R 31/2889 438/15 |
| 2017/0363486 | A1 | * | 12/2017 | Okulov ................... G01L 1/005 |

OTHER PUBLICATIONS

Lanterman et al.: "Micro-Four-Line Probe to Measure Electronic Conductivity and Contact Resistance of Thin-Film Battery Electrodes", Journal of The Electrochemical Society, vol. 162 (10), Aug. 10, 2015, pp. A2145-A2151.

Clement: "Flexible Micro-N-Line Probe and Apparatus to Characterize Electronic Conductivity of Li-ion Battery Electrode Films", A thesis submitted to the faculty of Brigham Young University, Nov. 15, 2017, 78 pages, retrieved from the internet on May 2, 2018, https://scholarsarchive.byu.edu/cgi/viewcontent.cgi?article=7550&context=etd.

* cited by examiner

FLEXIBLE ELECTRIC PROBE

CROSS-REFERENCE TO RELATED APPLICATION

This application is a 35 U.S.C. § 371 National Phase Entry Application from PCT Application No. PCT/US2018/016663, filed on Feb. 2, 2018, entitled "FLEXIBLE ELECTRIC PROBE", and designating the U.S., which claims the benefit of the filing date of U.S. Provisional Patent Application No. 62/453,846, filed on Feb. 2, 2017, entitled "Flexible, Compliant Multiline Microprobes for Measurements of Material Electrical Properties", the disclosures of both of which are incorporated herein by reference.

STATEMENT REGARDING FEDERALLY SPONSORED RESEARCH OR DEVELOPMENT

This invention was made with government support under grant number DE-AC02-05CH11231 awarded by the Department of Energy. The government has certain rights in the invention.

TECHNICAL FIELD

This document relates, generally, to a flexible electric probe.

BACKGROUND

Electric probes have been used for determining material properties such as impedance. Some electric probes have had a probe area formed by conductive points or lines on a substrate. Some probes have been formed on a rigid substrate made of glass and have had electrical connections leading to the probe, the electrical connections positioned on the same side of the rigid substrate as the probe area. Insulation placed over the electrical connections was made relatively thin so as to allow the probe area to be placed in contact with a sample. Also, in such probes, the large-scale connections to external apparatus were situated on the same side of the rigid substrate as the probe area, meaning that a sample to be probed should be small enough to clear the connections.

SUMMARY

In a first aspect, a flexible electric probe comprises: a flexible substrate; and probe line conductors on the flexible substrate, the probe line conductors being essentially parallel to each other and having separations of about 5-50 microns.

Implementations can include any or all of the following features. The flexible electric probe further comprises connection conductors on the flexible substrate, the connection conductors and the probe line conductors electrically connected to each other, the probe line conductors positioned in first and second offset patterns with regard to the connection conductors. The first offset pattern comprises that each probe line conductor of the probe line conductors is offset lengthwise with regard to an adjacent probe line conductor of the probe line conductors. The connection conductors are positioned on a first side of the flexible substrate, the probe line conductors are positioned on a second side of the flexible substrate, and the connection conductors and the probe line conductors are connected to each other through vias formed in the flexible substrate. The vias are positioned on alternating sides of the probe line conductors. An intermediate probe line conductor of the probe line conductors is positioned between two probe line conductors of the probe line conductors that terminate at adjacent vias, and the first offset pattern comprises that the intermediate probe line conductor is offset with regard to the two probe line conductors. The second offset pattern comprises that each of the probe line conductors terminates at a corresponding via of the vias using a respective termination location of multiple types of termination locations. The types of termination locations include: a first side of the via, a center of the via, and a second side of the via opposite the first side, and wherein the second offset pattern comprises that a first set of the vias use the termination locations of the first side of the via and the center of the via. The second offset pattern further comprises that a second set of the vias use the termination locations of the center of the via and the second side of the via. The probe line conductors include a first set of probe line conductors, and wherein the flexible electric probe further comprises multiple sets of probe line conductors on the second side of the flexible substrate. Each set of probe line conductors of the multiple sets of probe line conductors comprises four probe line conductors. At least one probe line conductor of the probe line conductors has a corresponding connection conductor of the connection conductors terminating at each of respective ends of the at least one probe line conductor. The flexible substrate comprises a polyimide material. The separations are about 20-30 microns.

In a second aspect, an apparatus comprises: a fixture; and a flexible electric probe mounted on the fixture, the flexible electric probe comprising: a flexible substrate; and probe line conductors on the flexible substrate, the probe line conductors being essentially parallel to each other and having separations of about 5-50 microns.

Implementations can include any or all of the following features. The apparatus further comprises connection conductors on the flexible substrate, the connection conductors and the probe line conductors electrically connected to each other, the probe line conductors positioned in first and second offset patterns with regard to the connection conductors. The connection conductors are positioned on a first side of the flexible substrate, the probe line conductors are positioned on a second side of the flexible substrate, and the connection conductors and the probe line conductors are connected to each other through vias formed in the flexible substrate. At least one probe line conductor of the probe line conductors has a corresponding connection conductor of the connection conductors terminating at each of respective ends of the at least one probe line conductor. The apparatus further comprises a force gauge that provides a force feedback loop in the apparatus. The apparatus further comprises a passage extending through the fixture, the flexible substrate has an opening or a transparent portion, the flexible electric probe positioned on the fixture so that the opening or transparent portion is aligned with an opening of the passage. The fixture includes a rounded surface on which at least part of the flexible electric probe is mounted. The fixture has a D shape including a plane surface between rounded surfaces, and the flexible electric probe is mounted on the rounded surfaces and on the plane surface, such that at least the probe line conductors are aligned with the plane surface. The fixture comprises an annular fixture, and wherein the flexible electric probe is mounted on a periphery of the annular fixture. The apparatus further comprises a shaft through the annular fixture. The flexible electric probe extends essentially around the periphery, and wherein the probe line conductors extend essentially around the periphery. The apparatus comprises multiple flexible electric probes including the flexible electric probe, the multiple flexible electric probes positioned on the periphery.

DETAILED DESCRIPTION

The present disclosure relates to flexible electric probes (FEPs). An FEP can be used for determining electrical properties (e.g., conductivity) of a material. The FEP can include a flexible substrate that can allow the FEP to assume a protruding geometry, which can facilitate use of the FEP in a variety of situations and/or to probe a range of different types of samples. For example, the protruding geometry can facilitate that the measurement area of the FEP, which can include a number of probe line conductors designed to contact the sample material, can be positioned arbitrarily close to or in contact with the material, without hindrance from other aspects of the FEP or its electrical connections.

The present disclosure describes techniques that can be applied to make measurements of the electrical properties of thin materials. In some implementations, films can be measured that have thicknesses in the range of about 10-150 microns or more. A measurement technique (e.g., one described by four-point probe theory) can be performed to determine electrical properties of such thin films if the probe line conductors of the FEP have a relatively small separation from each other. The separation can be about 5-50 microns. The separation can depend on the process used in forming the probe line conductors. In some implementations, the separation can be about 20-30 microns. For example, a separation of about 20 microns can be used.

In some implementations, one or more offset patterns can be used in the line conductors that are part of the probe circuitry. Such pattern(s) can allow formation of an advantageous density of line conductors on the probe. For example, the approach with one or more offset patterns can facilitate the formation of probe line conductors having adequately small separation.

Figure 1:
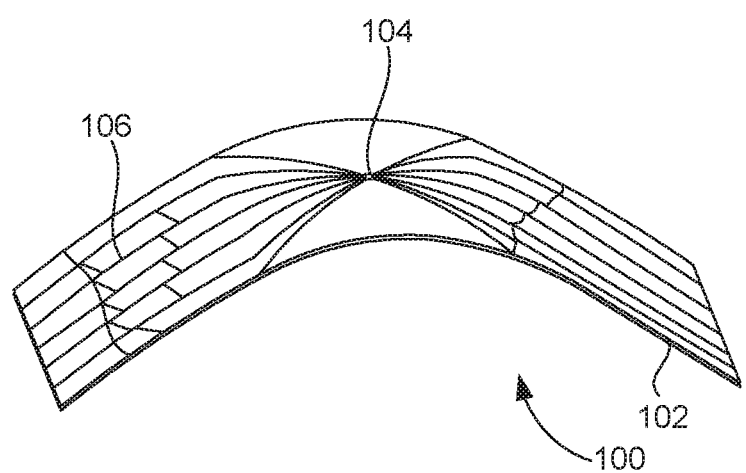
FIG. 1 shows an example of a flexible electric probe having probe line conductors and connection conductors on the same side of the flexible electric probe.
Figure 13:
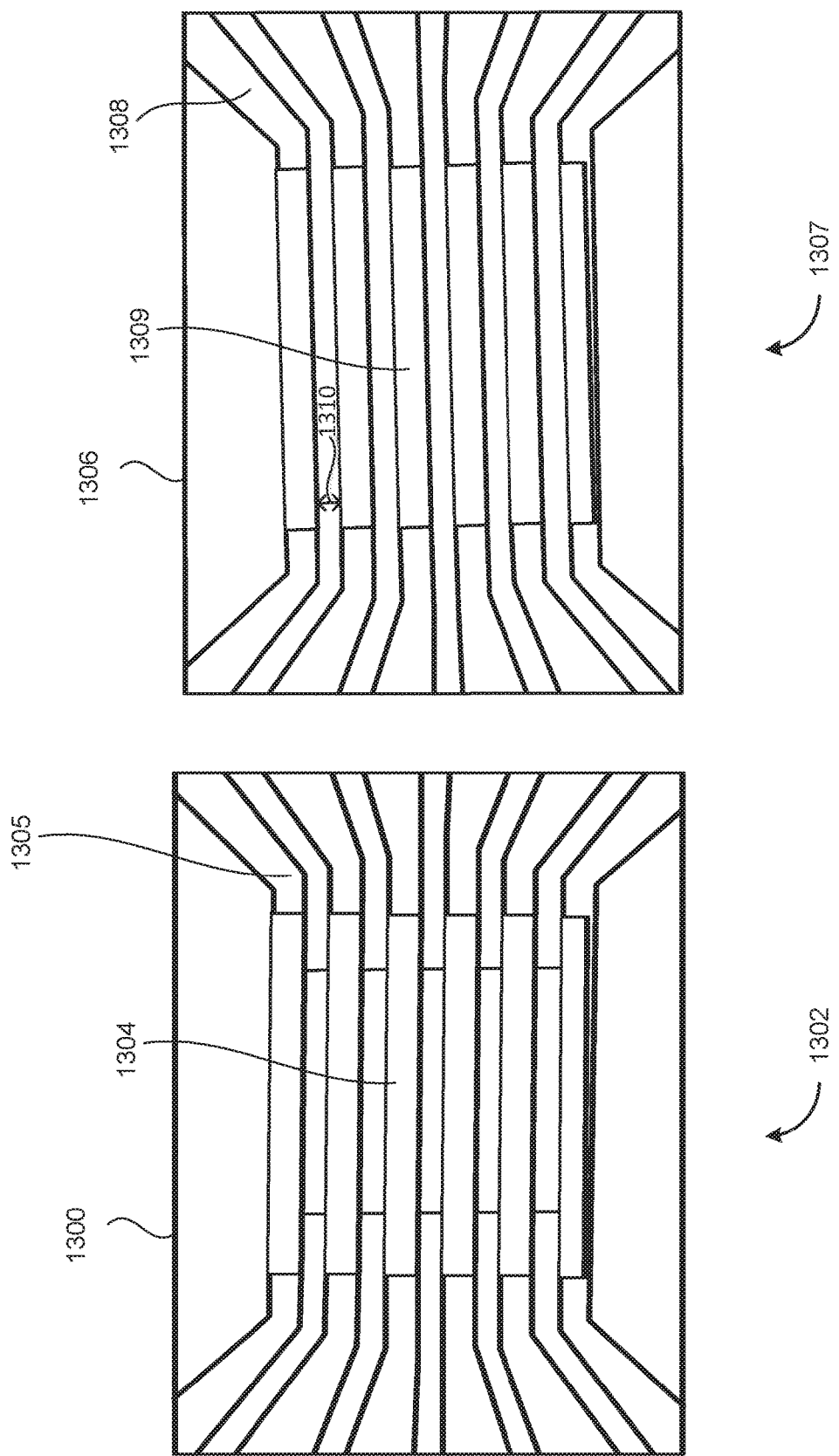
FIG. 13 shows micrographs of lines from flexible electric probes having probe line conductors and connection conductors on the same side of the flexible electric probe.

FIG. 1 shows an example of a FEP 100 having probe line conductors and connection conductors on the same side of the FEP 100. The FEP 100 is here shown in one of multiple possible flexed states. In some implementations, the FEP 100 can be flexed more, or less, than in this example. The FEP 100 includes a substrate 102. For example, the substrate is a flexible substrate that allows the FEP 100 to be flexed in one or more directions. The FEP 100 includes a probe area 104. In some implementations, the probe area 104 is configured to be placed in contact with, or in close proximity to, a sample to perform one or more electric measurements on the sample. For example, the probe area 104 can include one or more sets of probe line conductors formed on one side of the substrate 102. The FEP 100 includes connection conductors 106, in this example formed on the same side of the substrate 102 as the probe line conductors of the probe area 104. The connection conductors 106 form an electric connection between the probe area 104 (e.g., one or more probe line conductors thereof) and at least one piece of equipment, including, but not limited to, a computer. In some implementations, the connection conductors 106 and/or the probe area 104 can be formed by metal deposited on the substrate 102. The probe area of the FEP 100 features probe line conductors (e.g., as shown in FIG. 13) that have a separation suitable for measuring thin films. In some implementations, the separation can be about 5-50 microns. For example, the probe line conductors can have a separation of about 20-30 microns (e.g., about 20 microns).

The FEP 100 having probe line conductors and connection conductors on the same side of the FEP 100 can be formed in a cleanroom process, such as using material deposition techniques. For example, materials can be deposited on a substrate and/or existing deposits to form a pattern of conductors on the substrate. In another implementation, the connection conductors 106 can be formed on another side of the substrate 102 than the probe line conductors of the probe area 104 (e.g., on the opposite side of the substrate 102).

Figure 2:
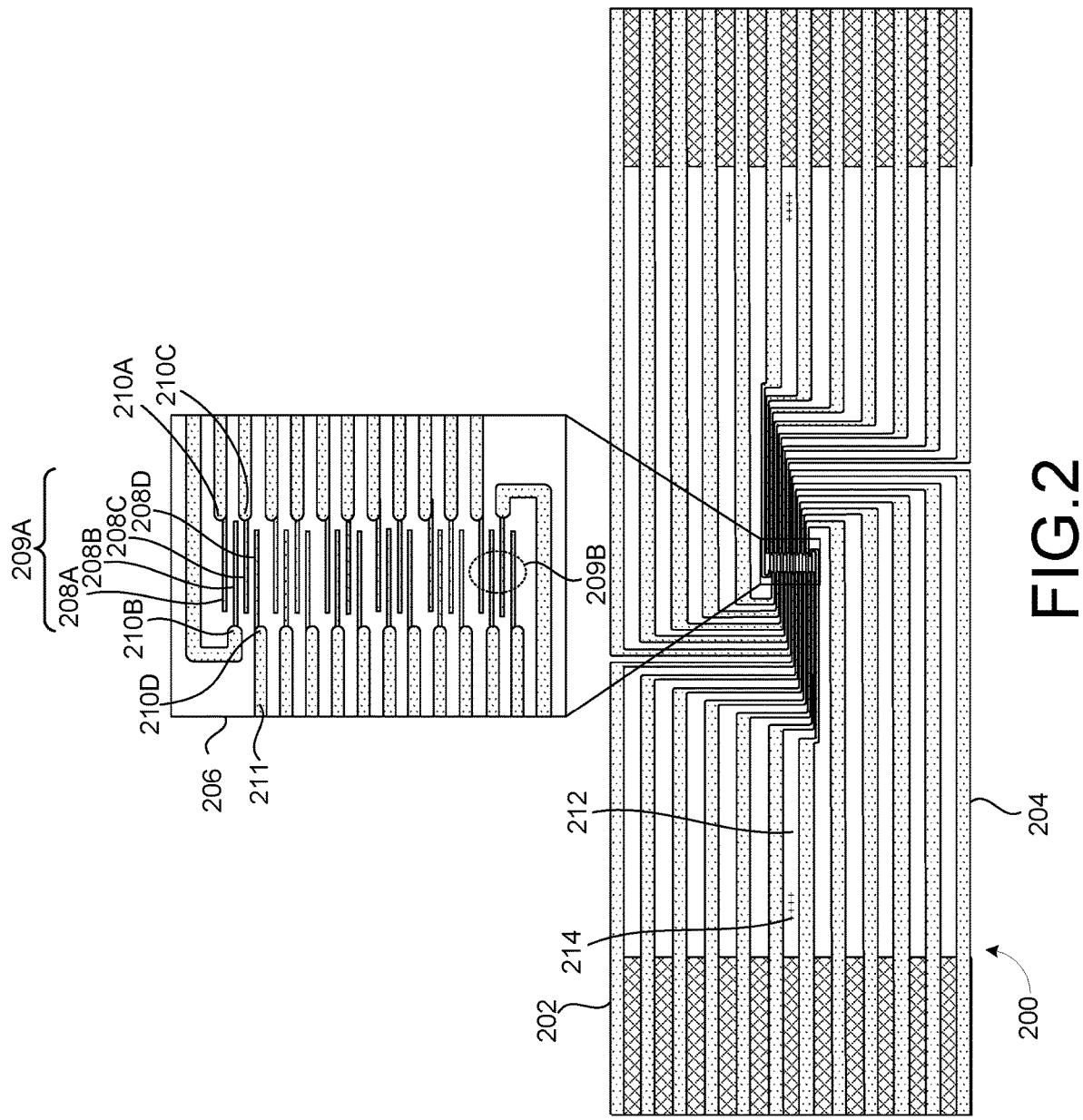
FIG. 2 shows another example of a flexible electric probe having probe line conductors and connection conductors on opposite sides of the flexible electric probe.

FIG. 2 shows another example of a FEP 200 having probe line conductors and connection conductors on opposite sides of the FEP 200. The FEP 200 includes a substrate 202, such as a substrate made of a flexible material. The FEP 200 includes connection conductors 204. For example, the connection conductors 204 are formed on one side of the substrate 202 (e.g., on the near side in this illustration). In some implementations, the connection conductors 204 have a pitch (e.g., 1 mm, or more or less) that bears a relation to a width of the substrate 202 (e.g., 11.5 mm, or more or less).

The FEP 200 includes a testing area 206, sometimes referred to as a probe area, here shown enlarged in an inset. The testing area 206 includes probe line conductors 208A, 208B, 208C and 208D that form a set 209A. In some implementations, the probe line conductors 208A-D and/or the connection conductors 204 can be manufactured using a laser process. For example, this can provide for use of thinner substrates and/or thinner depositions on the substrate.

The testing area 206 also includes vias formed in the substrate 202. For example, vias 210A-D for the set 209A are here formed adjacent the probe line conductors 208A-D, respectively. In some implementations, any or all of the vias 210A-D can be a passage formed through the substrate 202 to allow electric connection to be made to or from any of the probe line conductors 208A-D. For example, each of the probe line conductors 208A-D can terminate at a respective one of the vias 210A-D. The probe line conductors 208A-D can have a width and/or separation that allow them to perform measurements of electrical properties on one or more intended materials. In some implementations, the probe line conductors 208A-D can perform such measurements on a thin film (e.g., about 10-150 microns). For example, the probe line conductors can be about 25 microns wide and/or have a separation of about 25 microns.

The connection conductors 204 terminate at the vias 210A-D. At these termination points, ends 211 of the connection conductors 204 can be thinner than the connection conductors 204 elsewhere on the FEP 200. In some implementations, the ends 211 can be made as thin and/or closely spaced as possible given the intended manufacturing technique (e.g., a laser machining process). For example, this can allow the probe line conductors 208A-D to be formed with the smallest possible separation. For example, the ends 211 of the connection conductors 204 can here have a width of about 75 microns. The separation between the ends 211 of the connection conductors 204 can be chosen based on one or more circumstances. For example, the terminating ends (near the vias 210A-D) can have a separation of about 50 microns.

The testing area 206 here includes multiple sets of probe line conductors, including the set 209A. For example, a set 209B includes another group of probe line conductors. When multiple sets (e.g., the sets 209A-B and/or others) are present, they can be used simultaneously, or one or more sets can not be used while the other set(s) can be used. For example, this can provide redundancy if one or more sets breaks.

Here, each of the sets of probe line conductors in the testing area 206, including the sets 209A-B, includes four line conductors. For example, four-point probe theory describes an approach where current is injected in one probe conductor and removed through another probe conductor, whereas voltage is measured using two other probe conductors. In some implementations, there can be more or fewer probe line conductors in a set than four. That is, the present example illustrates that probe line conductors (e.g., the probe line conductors 208A-D) can form a first set of probe line conductors (e.g., the set 209A), and that the FEP 200 can include multiple sets of probe line conductors (e.g., also the set 209B) on a side of the substrate 202. The present example also illustrates that each set of probe line conductors (e.g., the set 209A or 209B) of multiple sets of probe line conductors can include four probe line conductors (e.g., the probe line conductors 208A-D).

Here, the probe line conductors 208A-D are all parallel to each other in the testing area 206. Also, the vias 210A and 210C are positioned on the right side (in the present view) of the probe line conductors 208A and 208C, respectively. The vias 210B and 210D, moreover, are positioned on the left side (in the present view) of the probe line conductors 208B and 208D, respectively. The present example illustrates that probe line conductors (e.g., the probe line conductors 208A-D) can be parallel to each other, and that vias (e.g., the vias 210A-D) can be positioned on alternating sides of the probe line conductors.

Sizing constraints can be taken into account in designing the FEP 200. In some implementations, a minimum size of the probe line conductors 208A-D, and/or of vias 210A-D at which the respective probe line conductors 208A-D terminate, can be considered. For example, a minimum size of the vias 210A-D can be considerably larger than, say, a cumulative width of the probe line conductors 208A-D and their spacing. In some implementations, the width of the probe line conductors 208A-D is about the same or similar to the pitch between adjacent ones of the probe line conductors 208A-D.

One or more offset patterns can be formed in the testing area 206. For example, this can help address a situation of competing minimum size requirements of the probe line conductors 208A-D and the vias 210A-D. Here, the probe line conductors 208A and 208B are adjacent each other. In this view, the probe line conductor 208A is here positioned further to the right than the probe line conductor 208B. Moreover, the probe line conductor 208B is here positioned further to the left than the probe line conductor 208C. Moreover, the probe line conductor 208C is here positioned further to the right than the probe line conductor 208D. The present example illustrates that an offset pattern can include that each probe line conductor (e.g., the probe line conductor 208A) of the probe line conductors is offset lengthwise (e.g., further to the right in at least one view) from an adjacent probe line conductor (e.g., the probe line conductor 208B) of the probe line conductors.

One or more probe line conductors can be considered an intermediate probe line conductor. For example, the probe line conductor 208B can here be considered an intermediate probe line conductor with regard to the probe line conductors 208A and 208C. The probe line conductor 208B in this view is positioned further to the left than the probe line conductors 208A and 208C. Moreover, the probe line conductors 208A and 208C terminate at the vias 210A and 210C, respectively. The vias 210A and 210C, finally, are adjacent each other. The present example illustrates that an intermediate probe line conductor (e.g., the probe line conductor 208B) of the probe line conductors can be positioned between two probe line conductors (e.g., the probe line conductors 208A and 208C) of the probe line conductors that terminate at adjacent vias (e.g., the vias 210A-B), and that an offset pattern can include that the intermediate probe line conductor is offset with regard to the two probe line conductors.

Any of multiple types of termination location can be used for the probe line conductors 208A-D. Here, the probe line conductor 208A terminates at the via 210A at a location that faces the via 210B. For example, this can be considered a termination location positioned at a first side of the via 210A. Here, the probe line conductor 208B terminates at the via 210B at a center location of the via 210B, and the probe line conductor 208C terminates at the via 210C at a center location of the via 210C. Here, the probe line conductor 208D terminates at the via 210D at a location that faces the via 210C. For example, this can be considered a termination location positioned at a second side of the via 210D, where the second side of the via (in this view, at the top of the via) is opposite the first side of the via (in this view, at the bottom of the via). That is, the probe line conductor 208A terminates at the first side of the via 210A, the probe line conductors 208B-C terminate at the corresponding centers of the vias 210B-C, respectively, and the probe line conductor 208D terminates at the second side of the via 210D. This pattern can be continued in others of the sets of probe line conductors.

In some implementations, an end of one or more of the probe line conductors 208A-D can terminate before a corresponding end of another of the probe line conductors 208A-D. For example, with regard to the probe line conductor 208A, in this view its left end (that does not terminate at a via) does terminate before the corresponding end of the probe line conductor 208B that terminates at the via 210B. Similarly, the end of the probe line conductor 208B terminates before the corresponding ends of the probe line conductors 208A and 208C that terminate at the vias 210A and 210C, respectively.

In some implementations, some or all of the probe line conductors 208A-D can be interleaved. For example, the probe line conductor 208B is interleaved with the probe line conductors 208A and 208C. For example, the probe line conductor 208C is interleaved with the probe line conductors 208B and 208D.

In some implementations, termination points of some or all of the probe line conductors 208A-D can be aligned. For example, the termination points of the probe line conductors 208A and 208C at the vias 210A and 210C, respectively, are aligned. For example, the termination points of the probe line conductors 208B and 208D at the vias 210B and 210D, respectively, are aligned.

In some implementations, some or all of the probe line conductors 208A-D can have essentially the same length. For example, the probe line conductors 208A-D here have the same length. The lengths can be the same within the corresponding set (e.g., 209A or 209B) or the lengths can be the same within all sets of the testing area 206, to name just two examples.

That is, the present example illustrates that an offset pattern can include that each of the probe line conductors terminates at a corresponding via of the vias using a respective termination location of multiple types of termination locations. For example, the types of termination locations can include: a first side of the via, a center of the via, and a second side of the via opposite the first side. For example, an offset pattern can include that a first set of the vias (e.g., those on the right side in this view) use the termination locations of the first side of the via and the center of the via. For example, an offset pattern can include that a second set of the vias (e.g., those on the left side in this view) use the termination locations of the center of the via and the second side of the via.

That is, the present example illustrates that a FEP can include a flexible substrate (e.g., the substrate 202 can be flexible); connection conductors can be positioned on the flexible substrate (e.g., the connection conductors 204); and probe line conductors are positioned on the flexible substrate (e.g., the probe line conductors 208A-D). The connection conductors and the probe line conductors can be electrically connected to each other. The probe line conductors can be positioned in first and second offset patterns with regard to the connection conductors.

The substrate can have one or more area 212 designated as a see-through area. In some implementations, the area 212 can facilitate inspection of the sample (not shown) toward which the FEP 200 is facing. For example, this can facilitate placement of the FEP 200 and/or the sample in correct position(s) so that the testing area 206 is applied to the correct portion(s) of the sample. For example, the area 212 can include an opening in the substrate 202 and/or a transparent material in the substrate 202. In some implementations, one or more alignment marks 214 can be placed in the area 212.

The FEP 200 having probe line conductors and connection conductors on opposite sides of the FEP 200 can be made using machining technique, such as a laser machining process. In another implementation, the connection conductors 204 can be formed on the same side of the substrate 202 as the probe line conductors 208A-D. For example, the vias 210A-D can then be omitted. In such implementations, the probe line conductors 208A-D can have one or more of the offset patterns mentioned in the above examples.

Figure 3:
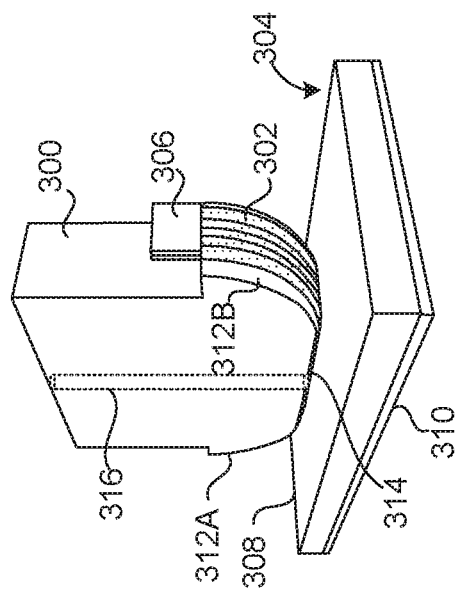
FIG. 3 shows an example of a movable fixture with a flexible electric probe having probe line conductors and connection conductors on the same side of the flexible electric probe.

FIG. 3 shows an example of a movable fixture 300 with a FEP 302 having probe line conductors and connection conductors on the same side of the FEP 302. In another implementation, the connection conductors of the FEP 302 can be formed on another side of a substrate of the FEP 302 than the probe line conductors (e.g., on the opposite side of such a substrate).

The moveable fixture 300 can be made from any suitable material that provides sufficient rigidity to move and hold the FEP 302 in a variety of positions, including abutting a sample 304 with a predetermined amount of pressure. For example, the moveable fixture 300 can include a synthetic material, including, but not limited to, a polymer material. The FEP 302 can include any or all FEPs described elsewhere herein. For example, the moveable fixture 300 can facilitate that electrical connections 306 are made on at least one side of the FEP 302.

The sample 304 can include a film 308, including, but not limited to, an electrode film. The film 308 can be placed onto one or more other materials 310, including but not limited to, a current collector material such as a metal. For example, the sample 304 can be a sheet of material intended for use in an electrolytic cell (e.g., an anode material and/or a cathode material).

The moveable fixture 300 can have any suitable shape. For example, the moveable fixture 300 here has a D-shape. The moveable fixture 300 here includes rounded surfaces 312A-B. Any suitable shape or profile can be used, such as a shape having a particular radius of curvature. Between the rounded surfaces can be one or more plane surfaces, here a plane surface 314. The FEP 302 can be placed onto the rounded surfaces 312A and/or 312B, and/or can be placed against the plane surface(s) 314. That is, the present example illustrates that a fixture (e.g., the moveable fixture 300) can include a rounded surface (e.g., the rounded surface 312A and/or 312B) on which at least part of the FEP (e.g., the FEP 302) is mounted. For example, a testing area of the FEP 302 (e.g., the testing area 206 in FIG. 2 with the probe line conductors 208A-D can be aligned with the plane surface 314.

The moveable fixture 300 can have any suitable shape. For example, the moveable fixture 300 here has a D-shape. The moveable fixture 300 here includes rounded surfaces 312A-B. Any suitable shape or profile can be used, such as a shape having a particular radius of curvature. Between the rounded surfaces can be one or more plane surfaces, here a plane surface 314. The FEP 302 can be placed onto the rounded surfaces 312A and/or 312B, and/or can be placed against the plane surface(s) 314. That is, the present example illustrates that a fixture (e.g., the moveable fixture 300) can include a rounded surface (e.g., the rounded surface 312A and/or 312B) on which at least part of the FEP (e.g., the FEP 302) is mounted. For example, a testing area of the FEP 302 (e.g., the testing area 206 in FIG. 2 with the probe line conductors 218A-D) can be aligned with the plane surface 314.

That is, the present example illustrates that the fixture (e.g., the moveable fixture 300) can have a D shape (e.g., the shape shown) including a plane surface (e.g., the plane surface 314) between rounded surfaces (e.g., the rounded surfaces 312A-B). The FEP (e.g., the FEP 302) can be mounted on the rounded surfaces and on the plane surface, such that at least the probe line conductors are aligned with the plane surface.

The moveable fixture 300 can have one or more passages extending at least partially through it. Here, a passage 316 illustrated in phantom extends from one side of the moveable fixture 300 (e.g., from the top thereof in this view) to another side of the moveable fixture 300 (e.g., to the bottom thereof in this view). The passage 316 can have any suitable shape, including, but not limited to, a linear shape. The passage 316 can have any suitable profile, including, but not limited to, a circular profile. The passage 316 can be essentially free of substantive material (e.g., so as to contain essentially only air or a vacuum). The passage 316 can include a material that conducts electromagnetic waves, including, but not limited to, an optically transparent or semi-transparent material.

The passage 316 can be used for one or more purposes. The passage 316 can be used to provide a view relating to the positioning of the FEP 302. In some implementations, the passage 316 can allow optical equipment (e.g., a microscope) to obtain one or more views of the sample 304 (e.g., through a feature such as the area 212 in FIG. 2). For example, the view(s) can facilitate placement of the FEP 302 and the sample 304 relative to each other so that the FEP 302 is applied to the correct portion(s) of the sample 304.

That is, the present example illustrates that an apparatus can include a fixture (e.g., the moveable fixture 300) and a FEP (e.g., the FEP 302). The FEP can include a flexible substrate (e.g., the substrate 202 in FIG. 2); connection conductors on the flexible substrate (e.g., the connection conductors 204 in FIG. 2); and probe line conductors on the flexible substrate (e.g., the probe line conductors 208A-D in FIG. 2). The connection conductors and the probe line conductors can be electrically connected to each other. The probe line conductors can be positioned in first and second offset patterns with regard to the connection conductors.

Figure 4:
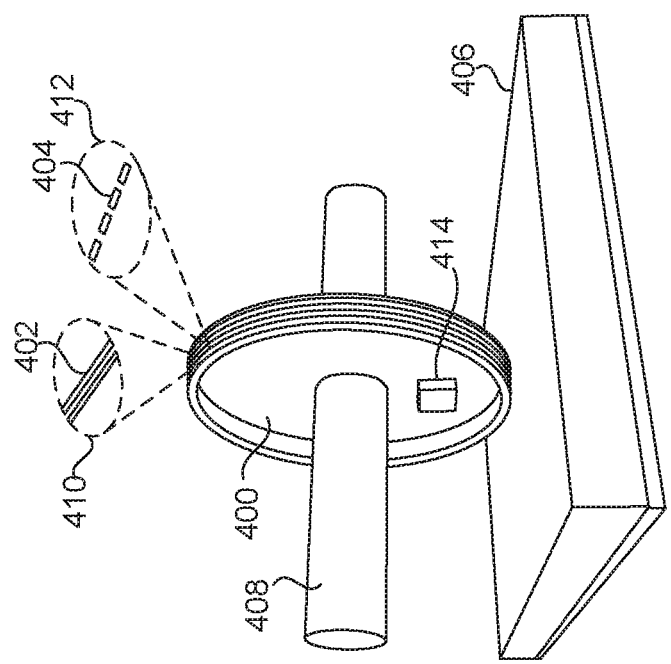
FIG. 4 shows an example of an annular fixture with at least one flexible electric probe.

FIG. 4 shows an example of an annular fixture 400 with at least one FEP 402 or 404. The annular fixture can be used to provide a rolling FEP. In some implementations, the annular fixture 400 essentially has the shape of a disc or wheel on which the FEP 402 or 404 can be positioned. The annular fixture 400 is an example of a fixture having at least one rounded surface. Any FEP described herein can be used as the FEP 402 or 404. The FEP 402 or 404 can be applied toward measurements on a sample 406 (e.g., similar to the sample 304 in FIG. 3). The annular fixture 400 is here coupled to a shaft 408 that is only partially shown. In some implementations, the shaft 408 extends further than shown in either or both directions. In some implementations, the shaft 408 can be coupled so that the shaft 408 can rotate about its longitudinal axis. For example, the annular fixture 400 can be applied to the surface of the sample 406 as the sample advances, the surface friction causing the annular fixture and the shaft 408 to rotate. For example, this can allow continuous, semi-continuous and/or intermittent measurements to be performed on the sample 406 as it travels (e.g., in a manufacturing process). In some implementations, the shaft 408 can be non-rotating and the annular fixture 400 can be allowed to rotate about the shaft 408. In some implementations, a driving mechanism (not shown) can be applied to rotate the annular fixture 400 about the (non-rotating) shaft 408. In some implementations, a driving mechanism (not shown) can be applied to rotate the annular fixture and the shaft 408 about the longitudinal axis of the shaft 408.

The FEP 402 or 404 can be positioned on the annular fixture 400 in any suitable way. In some implementations, an enlarged view 410 shows that the FEP 402 can extend around essentially the entire periphery of the annular fixture 400. The probe line conductors of the FEP 402 can then extend around essentially the entire periphery of the annular fixture 400. In some implementations, an enlarged view 412 shows that there are multiple FEPs 404 on the surface of the annular fixture 400. For example, the FEPs 404 can be evenly spaced about the circumference of the annular fixture 400. Electrical connections 414 can connect to the FEPs 402 and/or 404. For example, the electrical connections 414 can drive current to and from, and measure voltage on, some or all of the probe line conductors of the FEP 402 and/or 404.

That is, the present example illustrates that an apparatus can include a fixture (e.g., the annular fixture 400) and a FEP (e.g., the FEP 402 and/or 404). The FEP can include a flexible substrate (e.g., the substrate 202 in FIG. 2); connection conductors on the flexible substrate (e.g., the connection conductors 204 in FIG. 2); and probe line conductors on the flexible substrate (e.g., the probe line conductors 208A-D in FIG. 2). The connection conductors and the probe line conductors can be electrically connected to each other. The probe line conductors can be positioned in first and second offset patterns with regard to the connection conductors.

Figure 5:
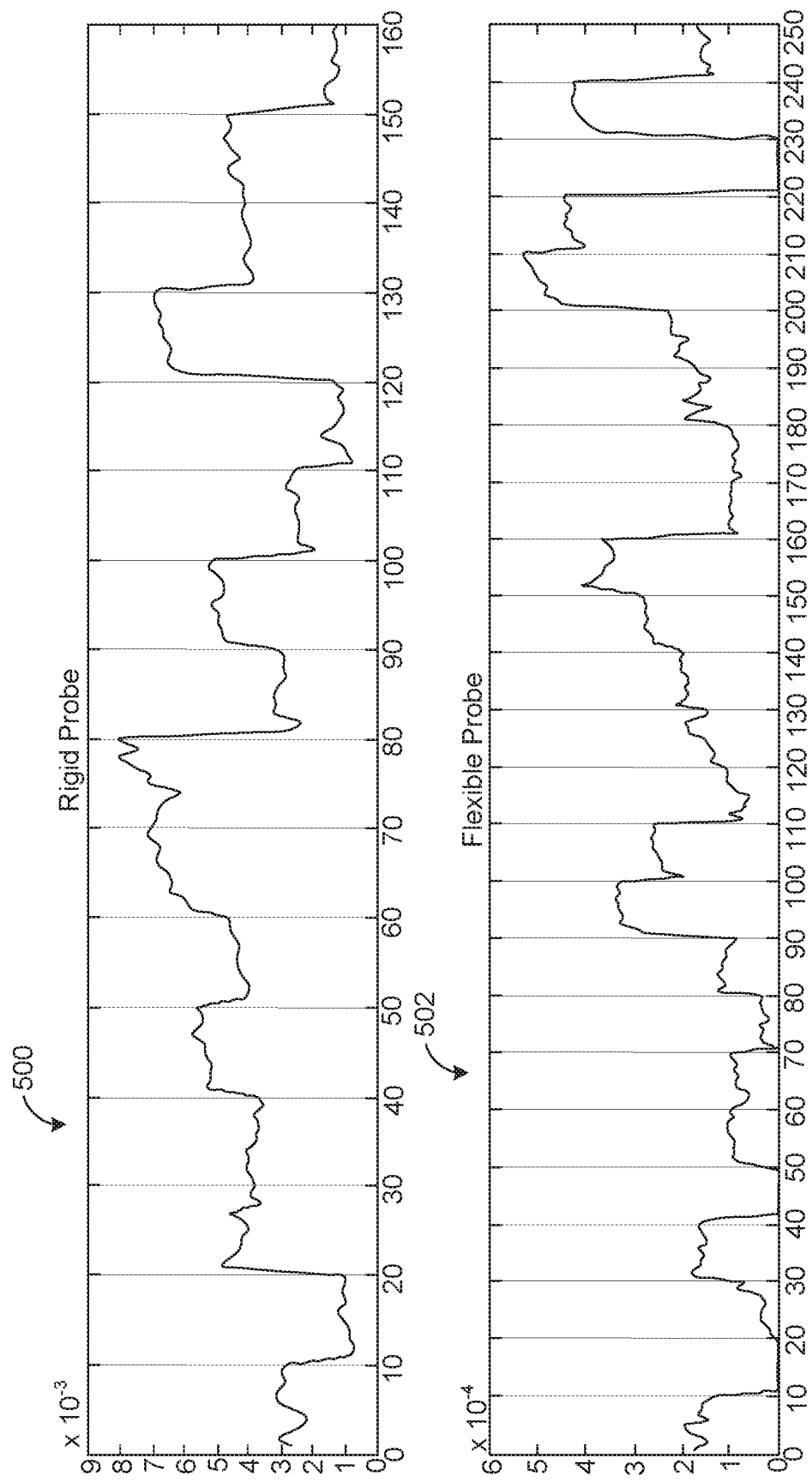
FIG. 5 shows conductivity from a prior-art electric probe and an example flexible electric probe according to the present disclosure.

FIG. 5 shows conductivity from a prior-art electric probe and an example flexible electric probe according to the present disclosure. A graph 500 shows the conductivity from the prior-art electric probe (here, a rigid probe). A graph 502 shows the conductivity from the example flexible electric probe according to the present disclosure. The magnitude of conductivity was similar in the rigid probe and the flexible probe. In some implementations, results can be considered consistent within any given location (e.g., a group of ten points). For example, reproducibility and/or repeatability of flex probe measurements can be significantly greater in the graph 502 than in the graph 500.

Figure 6:
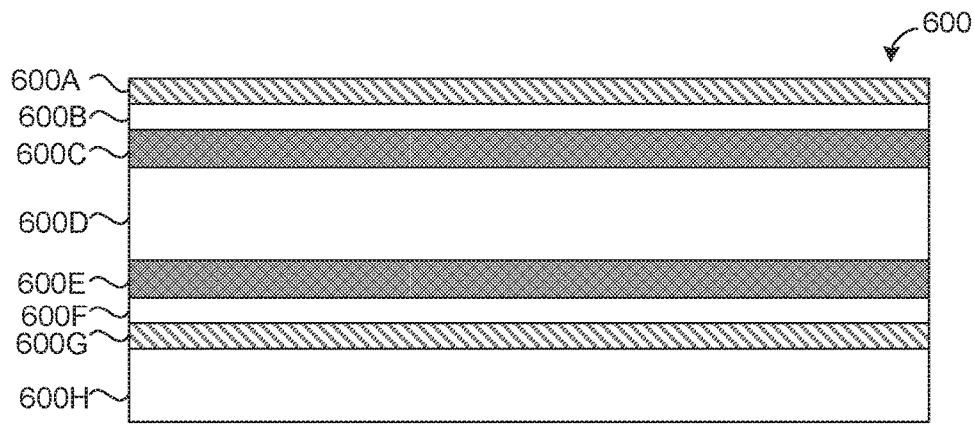
FIG. 6 shows examples of materials for a flexible electric probe.

FIG. 6 shows examples of materials 600 for a flexible electric probe. In some implementations, a material 600A can be a metal. For example, the material 600A can include a noble metal, including but not limited to, gold. In some implementations, a material 600B can be a metal. For example, the material 600B can include a transition metal, including but not limited to, nickel. In some implementations, a material 600C can be a metal. For example, the material 600C can include a metal with high thermal and/or electrical conductivity, including but not limited to, copper. In some implementations, a material 600D can be a flexible material, such as a polymer. For example, the material 600D can include a polymer of imide monomers, including but not limited to, polyimide. In some implementations, a material 600E can be a metal. For example, the material 600E can include a metal with high thermal and/or electrical conductivity, including but not limited to, copper. In some implementations, a material 600F can be a metal. For example, the material 600F can include a transition metal, including but not limited to, nickel. In some implementations, a material 600G can be a metal. For example, the material 600G can include a noble metal, including but not limited to, gold. In some implementations, a material 600H can be an insulating material, such as a polymer. For example, the material 600H can include a polymer of imide monomers, including but not limited to, polyimide. The material 600H can be flexible by way of being thin enough when implemented in the materials 600. As another example, depending on the thickness of the material 600H, a flexible insulating material can be chosen for the material 600H. Two or more of the materials 600A-H can be joined to each other using any suitable technique, including, but not limited to, deposition processes.

The materials 600A-H can have any of multiple suitable dimensions such as thickness. In some implementations, the material 600A has a thickness of about 0.120-0.130 µm, such as about 0.125 µm. In some implementations, the material 600B has a thickness of about 1.4-1.6 µm, such as about 1.5 µm. In some implementations, the material 600C has a thickness of about 3-5 µm, such as about 4 µm. In some implementations, the material 600D has a thickness of about 25-75 µm, such as about 50 µm. In some implementations, the material 600E has a thickness of about 3-5 µm, such as about 4 µm. In some implementations, the material 600F has a thickness of about 1.4-1.6 µm, such as about 1.5 µm. In some implementations, the material 600G has a thickness of about 0.120-0.130 µm, such as about 0.125 µm. In some implementations, the material 600H has a thickness of about 25-75 µm, such as about 50 µm. Other sizes can be used.

FIGS. 7A-D show an example of a manufacturing process 700 for creating a flexible electric probe. Here, the manufacturing process 700 can begin in FIG. 7A with providing a material stack of materials 700A-H. In some implementations, the materials 700A-H can include nickel, gold, copper and polymer. For example, the material 700A can include gold, the material 700B can include nickel, the material 700C can include copper, the materials 700D and/or 700E can include polymer, the material 700F can include copper, the material 700G can include nickel, and/or the material 700H can include gold.

Figure 7A:
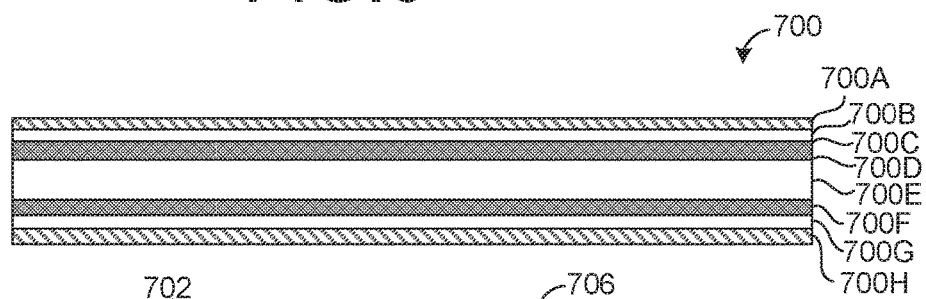
FIGS. 7A-D show an example of a manufacturing process for creating a flexible electric probe.
Figure 7B:
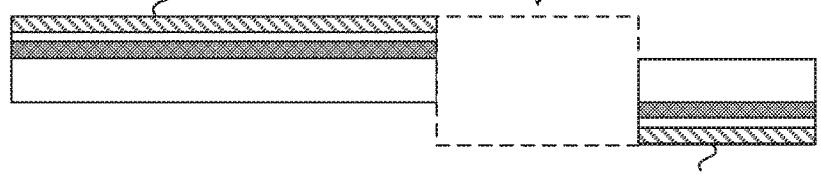

In FIG. 7B, material can be removed to leave a measurement area 702 (e.g., at the top in this view) and a measurement area 704 (e.g., at the bottom in this view). One or more vias 706 can be formed. For example, the via 706 can be formed by laser drilling.

Figure 7C:
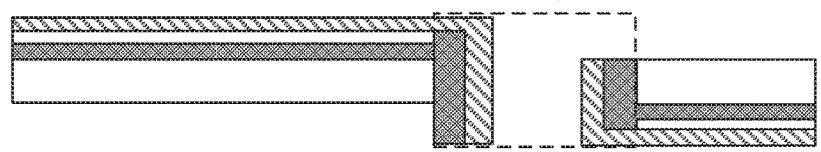

In FIG. 7C, sides of the via 706 can be plated to provide connectivity from a surface layer (e.g., at the top in this view) to another surface layer (e.g., at the bottom in this view). For example, the materials 700A and 700H can be connected to each other.

Figure 7D:
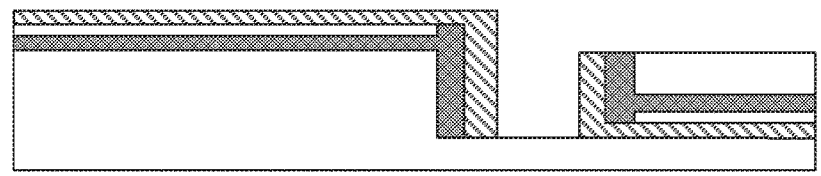

In FIG. 7D, the connection layer(s) can be covered for protection. For example, this can be done using a flexible insulator.

Figure 8A:
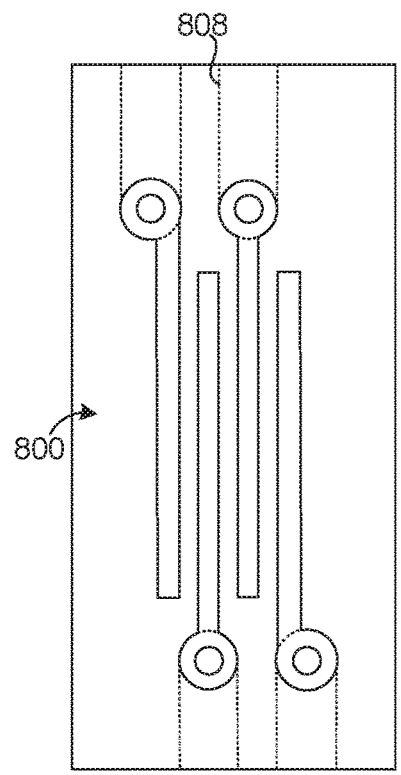
FIGS. 8A-C shows examples of a measurement surface that can be used in a flexible electric probe.
Figure 8B:
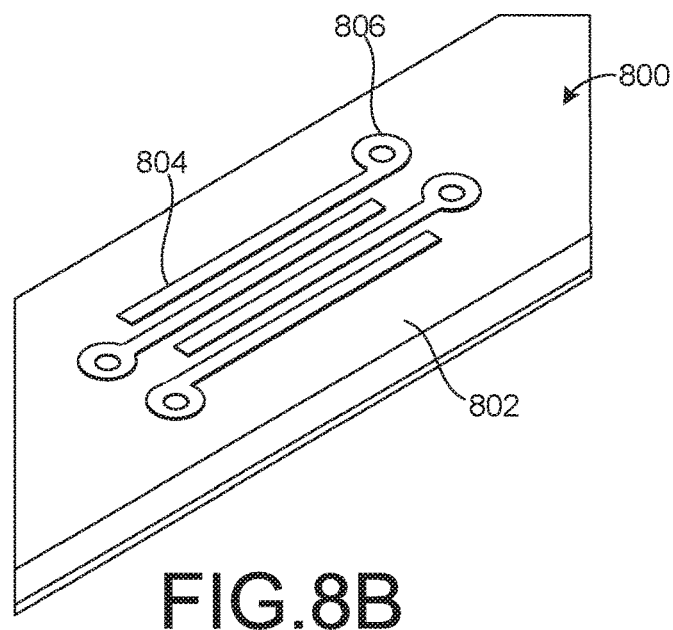
Figure 8C:
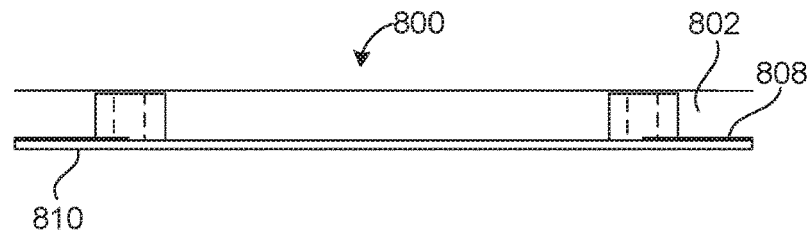

FIGS. 8A-C shows examples of a measurement surface 800 that can be used in a FEP. The measurement surface 800 is formed using a substrate 802, such as a flexible substrate similar or identical to any flexible substrate described herein. The measurement surface 800 includes probe line conductors 804, which are here parallel to each other. Each of the probe line conductors 804 terminates at a corresponding one of multiple vias 806. The vias 806 can be metal plated through the substrate 802. Any of the offset patterns described herein can be applied to the probe line conductors 804 and/or to the vias 806. The measurement surface 800 can include connections 808 to a computer or other measurement equipment. The connections 808 can be positioned on a reverse side of the substrate 802 from the probe line conductors 804. A flexible electrical isolation coverlay 810 can be applied on one or more surfaces of the FEP.

Figure 9:
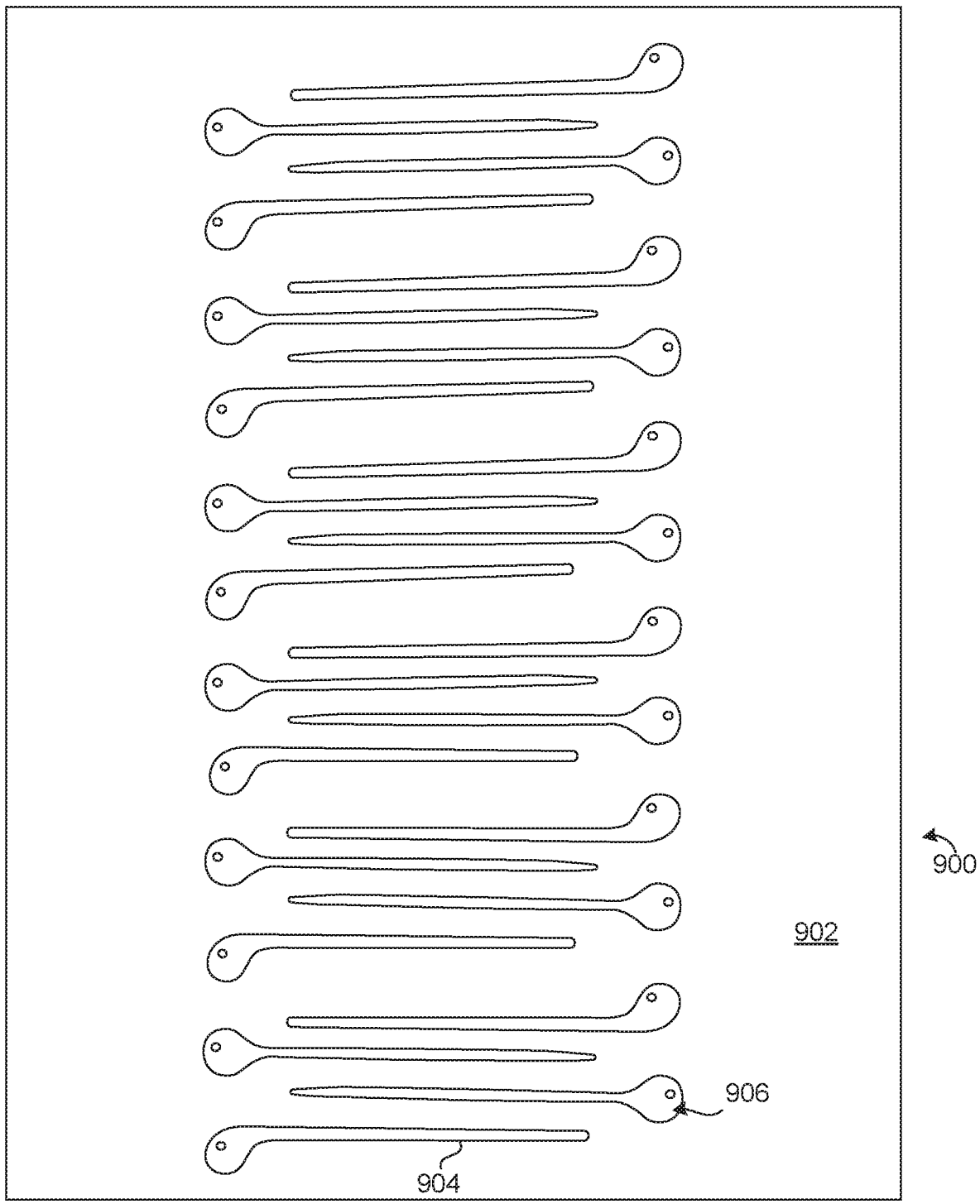
FIG. 9 shows an example of a test area that can be used in a flexible electric probe.

FIG. 9 shows an example of a test area 900 that can be used in a FEP. The test area 900 includes a substrate 902, including, but not limited to, any flexible substrate described herein. The test area 900 includes probe line conductors 904, including, but not limited to, any probe line conductors described herein. The test area 900 includes vias 906, including, but not limited to, any via described herein. Any of the offset patterns described herein can be applied to the probe line conductors 904 and/or to the vias 906.

Figure 10A:
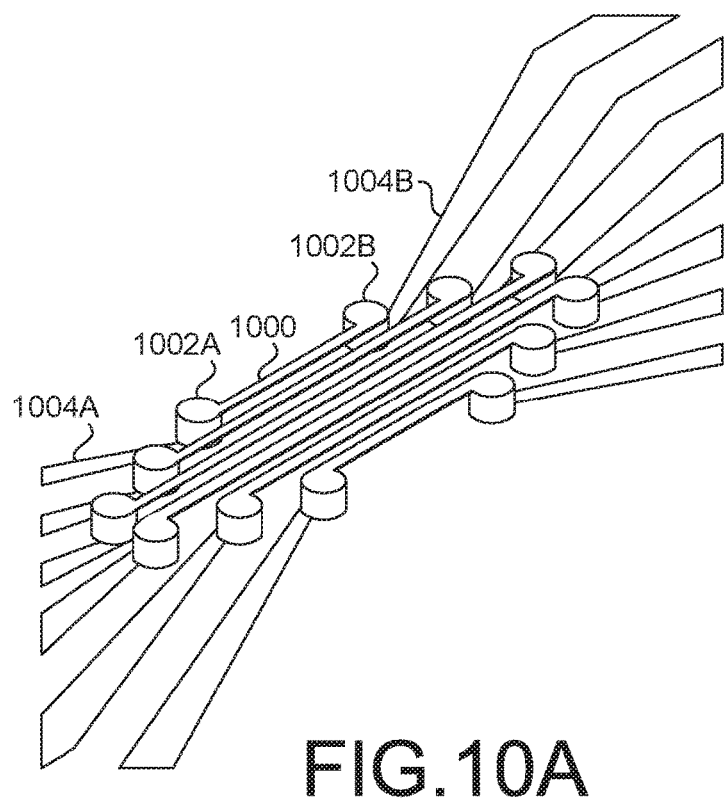
FIGS. 10A-B show an example of dual-connected probe lines.
Figure 10B:
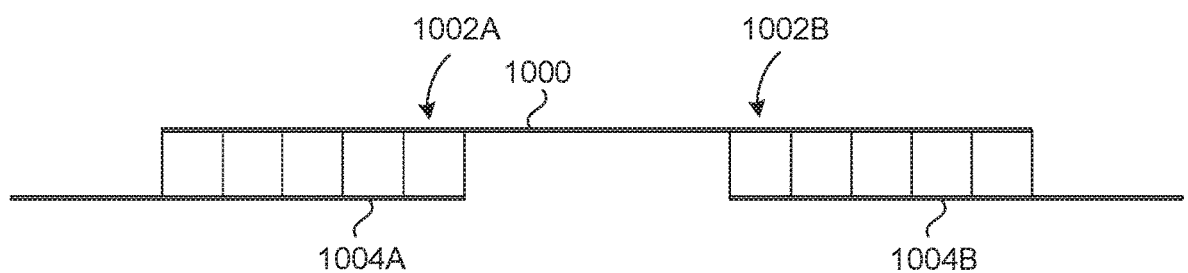

FIGS. 10A-B show an example of dual-connected probe lines 1000. Here, there are six of the dual-connected probe lines 1000, and more or fewer can be used in some implementations. The dual-connected probe lines 1000 can be applied in an FEP, analogous to any FEP described herein. Here, the dual-connected probe line 1000 terminates at respective vias 1002A-B, one at each end of the dual-connected probe line 1000. Vias of a minimum size may be required by a manufacturing process, and the dual-connected probe lines 1000 and/or the vias 1002A-B can have offset patters (e.g., be staggered) similar or identical to other examples described herein.

At the via 1002A, the dual-connected probe line 1000 connects to a connection conductor 1004A. For example, the connection conductor 1004A couples the dual-connected probe line 1000 to a computer or other equipment. At the via 1002B, the dual-connected probe line 1000 connects to a connection conductor 1004B. For example, metallic pathways can be formed. The connection conductor 1004B can couple the dual-connected probe line 1000 to a computer or other equipment. In some implementations, one of the connection conductors 1004A-B can be considered a secondary connection to the same or a different computer or equipment.

In some implementations, the dual-connected probe line 1000 can facilitate testing whether a probe line has any break(s) in it. This can be an additional check that one can perform to make sure that a device has electrical continuity across lines or whether it is starting to show signs of wear. For example, it can be convenient if the dual-connected probe lines 1000 become very thin so there are significant voltage drops across the line (this may be less of an issue with relatively thicker electrodes). As another example, it can provide two robust connections to each probe line. In some implementations, this can result in having half the number of devices for a given pitch of connections to the device.

Advantages of using the dual-connected probe lines 1000 can include, but are not limited to, performing continuity tests to determine any connection problems to the line from the outside circuit, performing resistance measurements to detect gradual degradation in the lines from one end to the other, providing better current delivery to the probe because two pathways exist (rather than one), for example if the lines are made of very thin layers of metal, and/or such dual-connected continuity and resistance tests can be implemented in software to automatically detect problems during the course of experiments.

Figure 11:
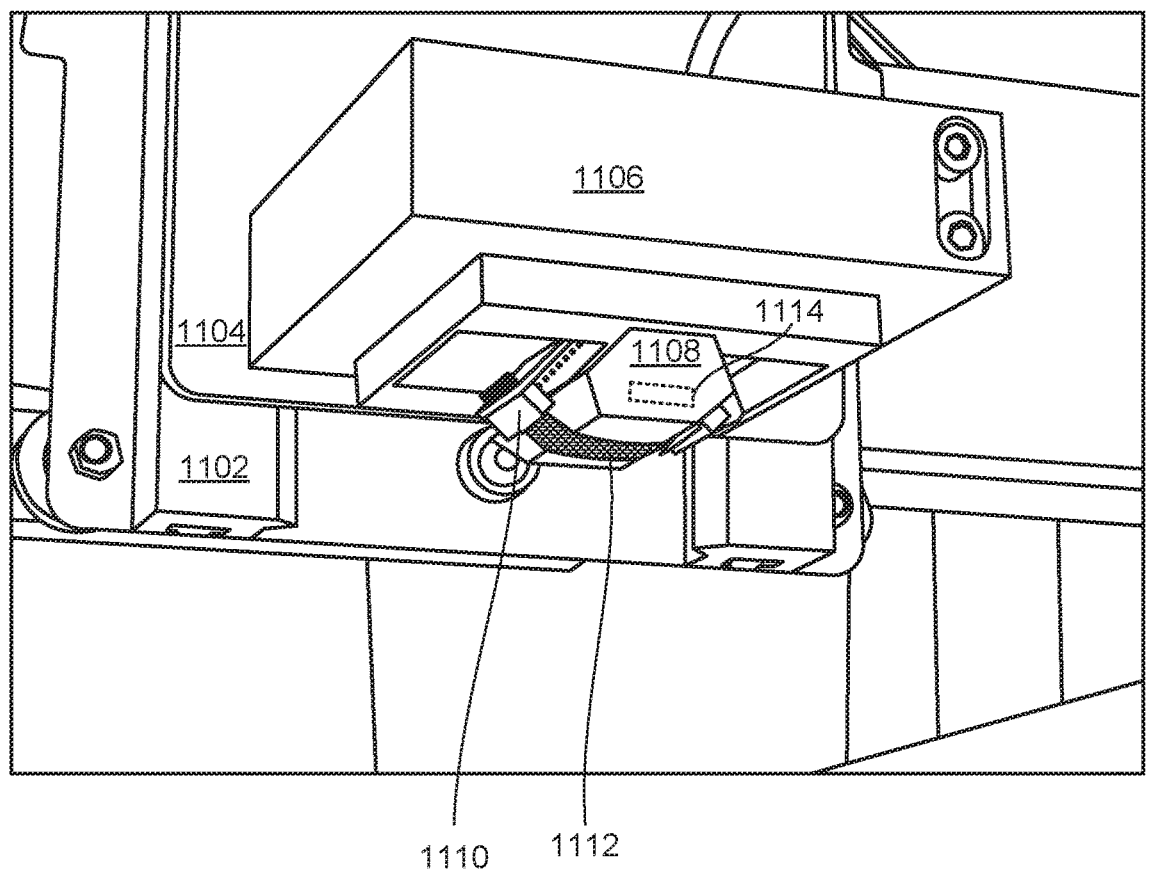
FIG. 11 shows an example of a measurement stage that can be used with a flexible electric probe.

FIG. 11 shows an example of a measurement stage 1100 that can be used with a FEP. The measurement stage 1100 can be used with any FEP described elsewhere herein. The measurement stage 1100 includes a track component 1102 on which a sled 1104 can be selectively moved and/or positioned. For example, the track component 1102 provides one or more tracks with which the sled 1104 can slidingly engage. The sled 1104 can be actuated manually (e.g., by a person's hand) and/or by a mechanism (e.g., one or more electrical motors on the sled 1104 and/or on the track component 1102). A holder 1106 is mounted to the sled 1104 so as to be moved and/or positioned according to the movement/position of the sled 1104. A fixture 1108 is mounted to the holder 1106. For example, the fixture 1108 can facilitate the placement of electrical connections 1110 (e.g., a ribbon electrical connection) for one or more FEP 1112. The FEP 1112 can be any FEP described herein. As such, the measurement stage 1100 can be used for positioning and/or moving the FEP 1112 into close proximity of, or into contact with, one or more sample materials (not shown). In some implementations, the sample includes a film and the measurement determines one or more electrical properties of the sample.

The measurement stage 1100 can control the force with which the FEP 1112 contacts the sample. A force gauge 1114 can be integrated in the fixture 1108, elsewhere in the measurement stage 1100, and/or adjacent the same (e.g., underneath the sample). The force gauge 1114 can be connected to the same computer control system as the remainder of the measurement stage 1100. For example, this can enable simultaneous or sequenced measurement of force and electrical properties. As another example, a feedback loop can be provided to control the force (or equivalently the pressure) on the sample by adjusting the height of the fixture 1108 relative to the sample. Pressure may have an effect on the electrical and mechanical properties of the FEP 1112, the sample, and/or the interface between the two. As another example, too much force/pressure could damage the FEP 1112 and/or the sample.

The force gauge 1114 can allow measurement of how much force is applied between the measurement stage 1100 and the sample. The force gauge 1114 can measure force in any suitable way, including, but not limited to, by a device that senses force applied to it and generates an electric signal in response. For example, the force gauge 1114 can include a load cell and/or a strain gauge.

The force gauge 1114 can provide force feedback in the operation of the measurement stage 1100. In some implementations, the force gauge 1114 can be part of a force feedback loop in which the force gauge 1114 generates a force signal that controls the operation of the measurement stage 1100, the operation of the measurement stage 1100 affects the amount of force between the FEP 1112 and the sample, the detected amount of force can affect the output of the force gauge 1114, and so on. For example, the force feedback can be based on essentially instantaneous measurements of force between the FEP 1112 and the sample. Such signal(s) can be provided to one or more components relating to the measurement stage 1100, including, but not limited to, to a computer that controls the measurement stage 1100. In some implementations, the signal(s) from the force gauge 1114 can be used to dynamically (e.g., in real time) control the operation of the measurement stage 1100. For example, the measurement stage 1100 can be controlled to apply more, or less, force between the FEP 1112 and the sample.

Figure 12:
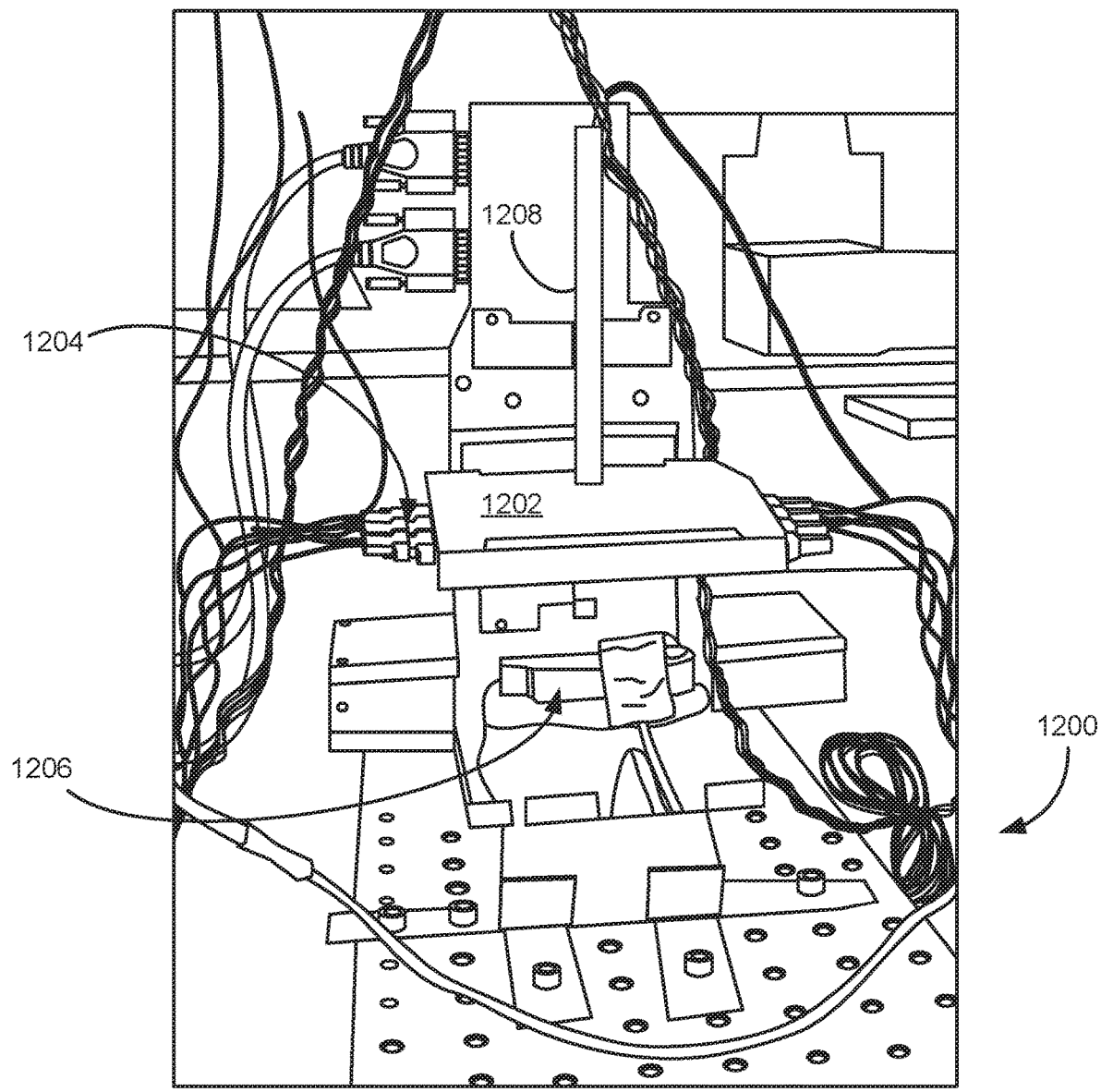
FIG. 12 shows an example of a 3-axis stage that can be used with a flexible electric probe.

FIG. 12 shows an example of a 3-axis stage 1200 that can be used with a FEP 1202. The 3-axis stage 1200 has electrical connections 1204 that connect the FEP 1202 and a computer or other equipment to each other. A moveable platform 1206 of the 3-axis stage 1200 can hold one or more sample materials to be measured using the FEP 1202. The 3-axis stage 1200 includes a microscope 1208 that can inspect the sample on the moveable platform 1206 through an opening and/or a transparent material in the FEP 1202. For example, this can allow the microscope (e.g., a universal serial bus (USB) microscope) to look through a transparent substrate that is part of the FEP 1202 to position the FEP 1202 and the sample relative to each other so that the appropriate location(s) of the sample can be measured.

FIG. 13 shows micrographs of lines from FEPs having probe line conductors and connection conductors on the same side of the FEP. For example, the micrographs show the probe area 104 of the FEP 100 in FIG. 1. A micrograph 1300 shows a FEP 1302 from a side of a measurement area 1304 that is formed on a substrate. Connection conductors 1305 extend outward from the measurement area 1304 to the edges of the FEP 1302 (not shown). A micrograph 1306, moreover, shows another FEP 1307, with connection conductors 1308 formed on a substrate and extending outward from a measurement area 1309 to the edges of the FEP 1307 (not shown). For example, the measurement area 1304 and/or 1309 can include dual-connected probe line conductors similar or identical to the dual-connected probe lines 1000 in FIGS. 10A-B. The probe line conductors of the measurement area 1304 and/or 1309 can have a small enough separation that allows the corresponding FEP 1302 or 1307 to perform measurements on thin films (e.g., films of about 10-150 microns thickness). In some implementations, a separation 1310 between adjacent probe line conductors can be about 5-50 microns. For example, the separation 1310 can be about 20-30 microns (e.g., about 20 microns).

A thin insulator can be applied to prevent electrical contact between the connection conductors 1305 and/or 1308 with the interrogated material. Such a thin insulator can delineate one or more edges of the measurement areas 1304 and/or 1309, respectively. The insulator can have a thickness that provides adequate insulation while not interfering with the intended contact between the probe line conductors and the sampled material. For example, an insulator having a thickness between about hundreds of nanometers to about a few microns can be used. In other implementations, the connection conductors 1305 and/or 1308 can be formed on another side of the substrate than the probe line conductors of the measurement area 1304 and/or 1309, respectively (e.g., on the opposite side of the corresponding substrate).

Figure 14A:
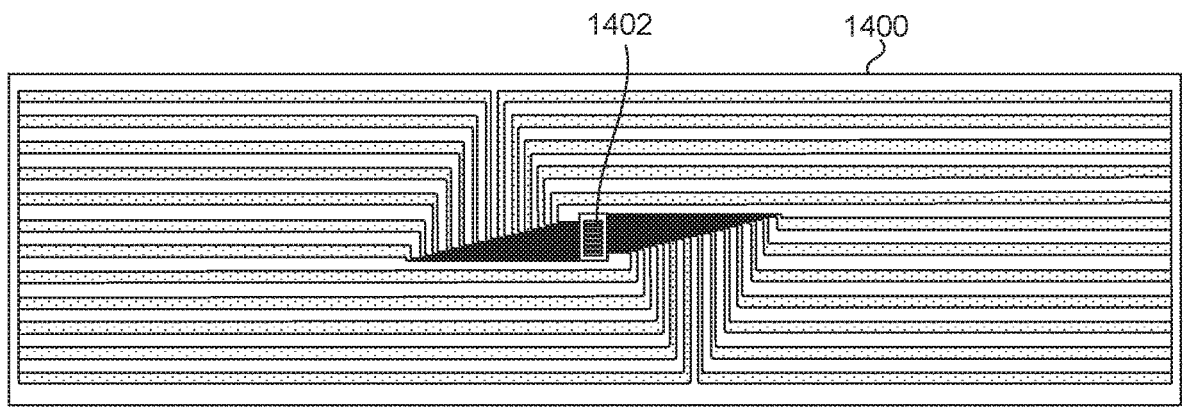
FIGS. 14A-B show examples of flexible electric probes.
Figure 14B:
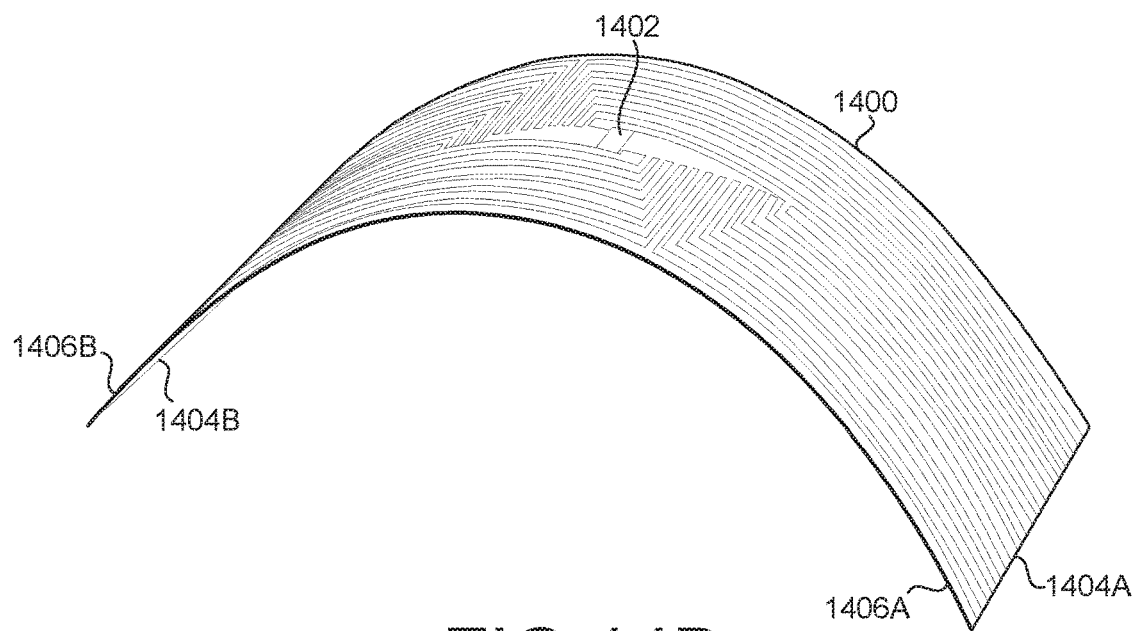

FIGS. 14A-B show examples of FEPs. In FIG. 14A, a FEP 1400 is shown in an essentially planar state. For example, a measurement area 1402 of the FEP 1400 (e.g., probe line conductors thereof) can be essentially planar in this configuration as is the rest of the FEP 1400.

The FEP can be flexible due to the inclusion of a flexible substrate. FIG. 14B shows the FEP 1400 in one of multiple possible flexed states. The FEP 1400 has a side edge 1404A (e.g., a short edge) and a side edge 1404B (e.g., another short edge opposite the edge 1404A). In some implementations, the FEP 1400 can be flexed so that the parts of the flexible substrate closest to the side edges 1404A-B, respectively, form a predefined angle with each other. For example, the FEP 1400 can be flexed so that a portion 1406A close to the side edge 1404A is essentially perpendicular to a portion 1406B close to the side edge 1404B. The measurement area 1402 can be essentially planar in this and/or another flexed state of the FEP 1400. For example, this can serve to reduce any effect on the measurements performed by probe line conductors in the measurement area 1402.

The flexibility of the FEP 1400 can provide one or more advantages. In some implementations, the FEP 1400 can be arranged in a protruding fashion so that, say, the measurement area 1402 is positioned away from both of the side edges 1404A-B. For example, this can facilitate connection of electrical conductors (e.g., a ribbon cable connection) for the FEP 1400 at either or both of those side edges 1404A-B.

The FEP 1400 can have connection conductors electrically connected to probe line conductors of the measurement area 1402. In some implementations, the connection conductors are on the same side of the substrate of the FEP 1400 as the probe line conductors. In some implementations, the connection conductors are on another side of the substrate of the FEP 1400 than the probe line conductors (e.g., on the opposite side of the substrate). For example, the FEP 1400 can be made using a cleanroom deposition process and/or a laser machining process.

Implementations of the various techniques described herein may be implemented in digital electronic circuitry, or in computer hardware, firmware, software, or in combinations of them. Implementations may be implemented as a computer program product (e.g., a computer program tangibly embodied in an information carrier, a machine-readable storage device, a computer-readable medium, a tangible computer-readable medium) for processing by, or to control the operation of, data processing apparatus, e.g., a programmable processor, a computer, or multiple computers. In some implementations, a tangible computer-readable storage medium can be configured to store instructions that when executed cause a processor to perform a process. A computer program, such as the computer program(s) described above, can be written in any form of programming language, including compiled or interpreted languages, and can be deployed in any form, including as a stand-alone program or as a module, component, subroutine, or other unit suitable for use in a computing environment. A computer program can be deployed to be processed on one computer or on multiple computers at one site or distributed across multiple sites and interconnected by a communication network.

Method steps may be performed by one or more programmable processors executing a computer program to perform functions by operating on input data and generating output. Method steps also may be performed by, and an apparatus may be implemented as, special-purpose logic circuitry (e.g., an FPGA (field programmable gate array) or an ASIC (application-specific integrated circuit)).

Processors suitable for the processing of a computer program include, by way of example, both general and special-purpose microprocessors, and any one or more processors of any kind of digital computer. Generally, a processor will receive instructions and data from a read-only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data (e.g., magnetic, magneto-optical disks, or optical disks). Information carriers suitable for embodying computer program instructions and data include all forms of non-volatile memory, including by way of example semiconductor memory devices (e.g., EPROM, EEPROM, and flash memory devices; magnetic disks (e.g., internal hard disks or removable disks); magneto-optical disks; and CD-ROM and DVD-ROM disks. The processor and the memory may be supplemented by, or incorporated in special-purpose logic circuitry.

To provide for interaction with a user, implementations may be implemented on a computer having a display device (e.g., a cathode ray tube (CRT), a light emitting diode (LED), or liquid crystal display (LCD) display device) for displaying information to the user and a keyboard and a pointing device, e.g., a mouse or a trackball, by which the user can provide input to the computer. Other kinds of devices can be used to provide for interaction with a user, as well; for example, feedback provided to the user can be any form of sensory feedback (e.g., visual feedback, auditory feedback, or tactile feedback); and input from the user can be received in any form, including acoustic, speech, or tactile input.

Implementations may be implemented in a computing system that includes a back-end component (e.g., as a data server), or that includes a middleware component (e.g., an application server), or that includes a front-end component (e.g., a client computer having a graphical user interface or a Web browser through which a user can interact with an implementation), or any combination of such back-end, middleware, or front-end components. Components may be interconnected by any form or medium of digital data communication (e.g., a communication network). Examples of communication networks include a local area network (LAN) and a wide area network (WAN) (e.g., the Internet).

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

While certain features of the described implementations have been illustrated as described herein, many modifications, substitutions, changes and equivalents will now occur to those skilled in the art. It is, therefore, to be understood that claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A flexible electric probe comprising:
   a flexible substrate; and
   probe line conductors on the flexible substrate, the probe line conductors being essentially parallel to each other and having separations of about 5-50 microns, wherein the probe line conductors include at least first, second, third, and fourth probe line conductors, the flexible electric probe configured to use the first through fourth probe line conductors as a four-point probe by injecting current in the first probe line conductor and removing current through the second probe line conductor, and by measuring voltage using the third and fourth probe line conductors.

2. The flexible electric probe of claim 1, further comprising connection conductors on the flexible substrate, the connection conductors and the probe line conductors electrically connected to each other, the probe line conductors positioned in first and second offset patterns with regard to the connection conductors.

3. The flexible electric probe of claim 2, wherein the first offset pattern comprises that each probe line conductor of the probe line conductors is offset lengthwise with regard to an adjacent probe line conductor of the probe line conductors.

4. The flexible electric probe of claim 2, wherein at least one probe line conductor of the probe line conductors has a corresponding connection conductor of the connection conductors terminating at each of respective ends of the at least one probe line conductor.

5. The flexible electric probe of claim 1, wherein the flexible substrate comprises a polyimide material.

6. The flexible electric probe of claim 1, wherein the separations are about 20-30 microns.

7. A flexible electric probe comprising:
a flexible substrate;
probe line conductors on the flexible substrate, the probe line conductors being essentially parallel to each other and having separations of about 5-50 microns; and
connection conductors on the flexible substrate, the connection conductors and the probe line conductors electrically connected to each other, the probe line conductors positioned in first and second offset patterns with regard to the connection conductors, wherein the connection conductors are positioned on a first side of the flexible substrate, wherein the probe line conductors are positioned on a second side of the flexible substrate, and wherein the connection conductors and the probe line conductors are connected to each other through vias formed in the flexible substrate.

8. The flexible electric probe of claim 7, wherein the vias are positioned on alternating sides of the probe line conductors.

9. The flexible electric probe of claim 7, wherein an intermediate probe line conductor of the probe line conductors is positioned between two probe line conductors of the probe line conductors that terminate at adjacent vias, and wherein the first offset pattern comprises that the intermediate probe line conductor is offset with regard to the two probe line conductors.

10. The flexible electric probe of claim 7, wherein the second offset pattern comprises that each of the probe line conductors terminates at a corresponding via of the vias using a respective termination location of multiple types of termination locations.

11. The flexible electric probe of claim 10, wherein the types of termination locations include: a first side of the via, a center of the via, and a second side of the via opposite the first side, and wherein the second offset pattern comprises that a first set of the vias use the termination locations of the first side of the via and the center of the via.

12. The flexible electric probe of claim 11, wherein the second offset pattern further comprises that a second set of the vias use the termination locations of the center of the via and the second side of the via.

13. The flexible electric probe of claim 7, wherein the probe line conductors include a first set of probe line conductors, and wherein the flexible electric probe further comprises multiple sets of probe line conductors on the second side of the flexible substrate.

14. The flexible electric probe of claim 13, wherein each set of probe line conductors of the multiple sets of probe line conductors comprises four probe line conductors.

15. An apparatus comprising:
a fixture; and
a flexible electric probe mounted on the fixture, the flexible electric probe comprising:
a flexible substrate;
probe line conductors on the flexible substrate including at least a first probe line conductor, the probe line conductors being essentially parallel to each other and having separations of about 5-50 microns; and
connection conductors including at least a first connection conductor, the connection conductors and the probe line conductors electrically connected to each other, the first connection conductor electrically connected to the first probe line conductor, the first connection conductor having a greater width than the first probe line conductor, wherein the first probe line conductor terminates at a side of the first connection conductor, the probe line conductors positioned in first and second offset patterns with regard to the connection conductors,
wherein the second offset pattern comprises at least that the first probe line conductor terminates at the side of the first connection conductor,
wherein the connection conductors are positioned on a first side of the flexible substrate, wherein the probe line conductors are positioned on a second side of the flexible substrate, and
wherein the connection conductors and the probe line conductors are connected to each other through vias formed in the flexible substrate.

16. The apparatus of claim 15, wherein at least one probe line conductor of the probe line conductors has a corresponding connection conductor of the connection conductors terminating at each of respective ends of the at least one probe line conductor.

17. The apparatus of claim 15, further comprising a force gauge that provides a force feedback loop in the apparatus.

18. The apparatus of claim 15, wherein the fixture includes a rounded surface on which at least part of the flexible electric probe is mounted.

19. The apparatus of claim 18, wherein the fixture has a D shape including a plane surface between rounded surfaces, and wherein the flexible electric probe is mounted on the rounded surfaces and on the plane surface, such that at least the probe line conductors are aligned with the plane surface.

20. The apparatus of claim 18, wherein the fixture comprises an annular fixture, and wherein the flexible electric probe is mounted on a periphery of the annular fixture.

21. The apparatus of claim 20, further comprising a shaft through the annular fixture.

22. The apparatus of claim 20, wherein the flexible electric probe extends essentially around the periphery, and wherein the probe line conductors extend essentially around the periphery.

23. The apparatus of claim 20, the apparatus comprising multiple flexible electric probes including the flexible electric probe, the multiple flexible electric probes positioned on the periphery.

24. An apparatus comprising:
a fixture;
a flexible electric probe mounted on the fixture, the flexible electric probe comprising:

a flexible substrate; and probe line conductors on the flexible substrate, the probe line conductors being essentially parallel to each other and having separations of about 5-50 microns; and a passage extending through the fixture, wherein the flexible substrate has an opening or a transparent portion, the flexible electric probe positioned on the fixture so that the opening or transparent portion is aligned with an opening of the passage.

* * * * *